(12) United States Patent
Ahmed et al.

(10) Patent No.: US 11,889,647 B2
(45) Date of Patent: Jan. 30, 2024

(54) DISPLAY PANEL BEND REINFORCEMENT

(71) Applicant: Apple Inc., Cupertino, CA (US)

(72) Inventors: Izhar Z. Ahmed, Saratoga, CA (US); John J. Baker, Campbell, CA (US); Bulong Wu, San Jose, CA (US); Daniel W. Jarvis, Sunnyvale, CA (US); Douglas G. Fournier, San Jose, CA (US); Eric W. Bates, San Jose, CA (US); Hao Dong, Santa Clara, CA (US); Isabel S Gueble, Sunnyvale, CA (US); Jason C. Law, Foster City, CA (US); Jingjing Xu, Cupertino, CA (US); Kikue S. Burnham, San Ramon, CA (US); Paul U. Leutheuser, Saratoga, CA (US); Sarah Trabia, San Jose, CA (US); Sawyer I. Cohen, Menlo Park, CA (US); Shaorui Yang, San Jose, CA (US); Shaowei Qin, Milpitas, CA (US); Siddharth Avachat, San Jose, CA (US); Yaocheng Zhang, Sunnyvale, CA (US); Ying-Chih Wang, Sunnyvale, CA (US); Zhen Zhang, Sunnyvale, CA (US); Benjamin R. Pope, Woodside, CA (US)

(73) Assignee: APPLE INC., Cupertino, CA (US)

( * ) Notice: Subject to any disclaimer, the term of this patent is extended or adjusted under 35 U.S.C. 154(b) by 80 days.

(21) Appl. No.: 16/997,665

(22) Filed: Aug. 19, 2020

(65) Prior Publication Data
US 2022/0061179 A1 Feb. 24, 2022

(51) Int. Cl.
*H05K 5/06* (2006.01)
*G06F 1/16* (2006.01)
(Continued)

(52) U.S. Cl.
CPC .......... *H05K 5/064* (2013.01); *G06F 1/1626* (2013.01); *G06F 1/1652* (2013.01); *H05K 1/028* (2013.01); *H05K 3/284* (2013.01)

(58) Field of Classification Search
CPC ........ H05K 5/064; H05K 1/028; H05K 3/284; G06F 1/1626; G06F 1/1652
(Continued)

(56) References Cited

U.S. PATENT DOCUMENTS

| 7,236,357 B2 | 6/2007 | Chen |
| 8,773,847 B2 | 7/2014 | Byun et al. |

(Continued)

FOREIGN PATENT DOCUMENTS

| CN | 104050884 A | 9/2014 |
| CN | 104103669 A | 10/2014 |

(Continued)

OTHER PUBLICATIONS

PCT International Search Report and Written Opinion for International Application No. PCT/US2019/061734, dated May 15, 2020 (34 pp.).

*Primary Examiner* — Charles S Chang
(74) *Attorney, Agent, or Firm* — DORSEY & WHITNEY LLP

(57) ABSTRACT

An electronic device includes a housing that defines an aperture, and a display assembly positioned in the aperture. The display assembly can include a display layer having a first portion, and a second portion bending at least partially below the first portion. The first portion and the second portion can define a bend volume, and a potting material can be disposed in the bend volume, such that the potting material contacts the first portion and the second portion. An internal enclosure can be contoured to the display assembly.

19 Claims, 13 Drawing Sheets

(51) Int. Cl.
*H05K 1/02* (2006.01)
*H05K 3/28* (2006.01)

(58) Field of Classification Search
USPC .................................................... 349/58–60
See application file for complete search history.

(56) References Cited

U.S. PATENT DOCUMENTS

| | | | |
|---|---|---|---|
| 8,792,249 B2 | 7/2014 | Sasamori et al. | |
| 10,168,737 B2 | 1/2019 | Kemppinen | |
| 10,180,702 B2 | 1/2019 | Dabov et al. | |
| 10,512,184 B2 | 12/2019 | Cho et al. | |
| 10,568,218 B1 | 2/2020 | Xu et al. | |
| 10,788,697 B2 | 9/2020 | Kitagawa et al. | |
| 11,051,412 B2 | 6/2021 | Zeng | |
| 11,281,259 B2 | 3/2022 | Cha et al. | |
| 11,284,547 B2 | 3/2022 | Shin | |
| 11,444,260 B2 | 9/2022 | Choi et al. | |
| 2007/0229727 A1 | 10/2007 | Yamazaki | |
| 2012/0076573 A1 | 3/2012 | Pilliod et al. | |
| 2012/0149437 A1 | 6/2012 | Zurek et al. | |
| 2013/0043054 A1 | 2/2013 | Ho | |
| 2013/0065476 A1 | 3/2013 | Kim | |
| 2015/0245513 A1 | 8/2015 | Moon | |
| 2016/0174398 A1 | 6/2016 | Ido | |
| 2016/0207236 A1 | 7/2016 | Tsubota et al. | |
| 2017/0047547 A1 | 2/2017 | Son et al. | |
| 2017/0069956 A1 | 3/2017 | Hill et al. | |
| 2017/0099742 A1 | 4/2017 | Choi et al. | |
| 2017/0196110 A1 | 7/2017 | Shinn | |
| 2018/0011576 A1* | 1/2018 | Ryu | G06F 1/1652 |
| 2018/0017995 A1 | 1/2018 | Gable et al. | |
| 2018/0019440 A1 | 1/2018 | Namkung | |
| 2018/0033571 A1 | 2/2018 | Choi et al. | |
| 2018/0059728 A1 | 3/2018 | Kim et al. | |
| 2018/0081399 A1 | 3/2018 | Kwon et al. | |
| 2018/0081481 A1* | 3/2018 | Fournier | H05K 7/20963 |
| 2018/0084680 A1 | 3/2018 | Jarvis et al. | |
| 2018/0088392 A1* | 3/2018 | Park | B32B 7/06 |
| 2018/0103557 A1 | 4/2018 | Wright et al. | |
| 2018/0199457 A1 | 7/2018 | Cheng | |
| 2018/0284935 A1* | 10/2018 | Lee | G06F 1/1656 |
| 2018/0314091 A1 | 11/2018 | Kwon | |
| 2020/0020754 A1* | 1/2020 | Kim | H10K 59/87 |
| 2020/0271977 A1* | 8/2020 | Chen | G02F 1/13452 |
| 2021/0204434 A1 | 7/2021 | Hooton et al. | |
| 2021/0405688 A1* | 12/2021 | Barrett | G09F 9/301 |
| 2022/0061166 A1 | 2/2022 | Burke et al. | |

FOREIGN PATENT DOCUMENTS

| | | |
|---|---|---|
| CN | 106847871 A | 6/2017 |
| CN | 107871713 A | 4/2018 |
| CN | 108281387 A | 7/2018 |
| CN | 108573656 A | 9/2018 |
| CN | 108681123 A | 10/2018 |
| CN | 108986661 A | 12/2018 |
| CN | 109065570 A | 12/2018 |
| CN | 109074190 A | 12/2018 |
| CN | 109859632 A | 6/2019 |
| CN | 109904203 A | 6/2019 |
| CN | 110444121 A | 11/2019 |
| DE | 3732206 A1 | 4/1989 |
| GB | 1373962 A | 11/1974 |
| JP | 2017142376 A | 8/2017 |
| KR | 20030082131 A | 10/2003 |
| KR | 20160141260 A | 12/2016 |
| KR | 20180069763 A | 6/2018 |
| KR | 20190072876 A | 6/2019 |
| TW | 201737474 A | 10/2017 |

\* cited by examiner

DISPLAY PANEL BEND REINFORCEMENT

FIELD

The described embodiments relate generally to improved robustness of an electronic device. More particularly, the present embodiments relate to filler material that improves the robustness and water resistance of a mobile display.

BACKGROUND

In use, modern electronic devices are subject to a wide range of hazardous conditions such as forces from drop and fall events or stresses caused by compression. These considerations can be particularly relevant to portable electronic and mobile device applications, where sensitive control and display components may be commonly exposed to stress events and undesirable environmental conditions.

A number of possible solutions have been developed to address these concerns, but these solutions typically involve bulky isolation components that isolate and protect components, but typically drastically increase the size of a device and can negatively impact device performance and user experience. Accordingly, there remains a need for improved robustness of advanced consumer electronics and other digital device applications that do not undesirably increase the size of the device or impact performance. In particular, there is a need for increased impact protection and resistance to environmental exposure suitable for modern electronic devices.

SUMMARY

According to some examples of the present disclosure, an electronic device includes a housing that defines an aperture, and a display assembly positioned in the aperture. The display assembly can include a display layer having a first portion, and a second portion bending at least partially below the first portion. The first portion and the second portion can define a bend volume, and a potting material can be disposed in the bend volume such that the potting material contacts the first portion and the second portion. An internal enclosure can be contoured to the display assembly.

In some examples, the potting material can be deposited on the display layer before the display layer is bent. The potting material can have a modulus of about 150 megapascals to about 300 megapascals. In some examples, a strain-neutralization layer can be included on an exterior of the display layer, opposite the bend volume, such that the display layer is positioned between the strain-neutralization layer and the potting material.

In some examples, the potting material is pre-cured. The potting material can be pre-cured with ultraviolet light before the display layer is bent. In some examples, the potting material is moisture cured. For example, the potting material can be moisture cured after the display layer is bent. In some examples a gap exists adjacent the potting material, the gap can allow for moisture to cure the potting material.

According to some examples, an electronic device includes a housing defining an aperture, and a display assembly positioned in the aperture. The display assembly can include a display layer that is bent to define a bend region and a tail portion. A display integrated circuit can be coupled to the display layer, and supportive materials can be bonded to the display assembly.

In some examples, the display integrated circuit is attached to the tail portion. The supportive materials can include a stiffener plate that is positioned in-plane with the display integrated circuit. The stiffener plate can have a thickness of about 50 microns to about 90 microns. In some examples, the supportive materials include a potting compound that at least partially surrounds the display integrated circuit. The supportive materials can include foam positioned between the display integrated circuit and an internal enclosure. In some examples, the supportive materials are positioned between an active region of the display assembly and the tail portion.

According to some examples, a display assembly includes a display layer having an active area, a tail portion bending adjacent the active area, and a bend region connecting the active area and the tail portion. The bend region can define a first curved surface and a second curved surface opposite the first curved surface. A potting material can be disposed in the first curved surface. A strain-neutralization layer can overlay at least a portion of the second curved surface, and a display integrated circuit can be attached to the bend region.

In some examples, the potting material adheres to polyimide. The potting material can be injected into the first curved surface of the bend region. In some examples, the bend region is about a 180 degree fold in the display layer.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
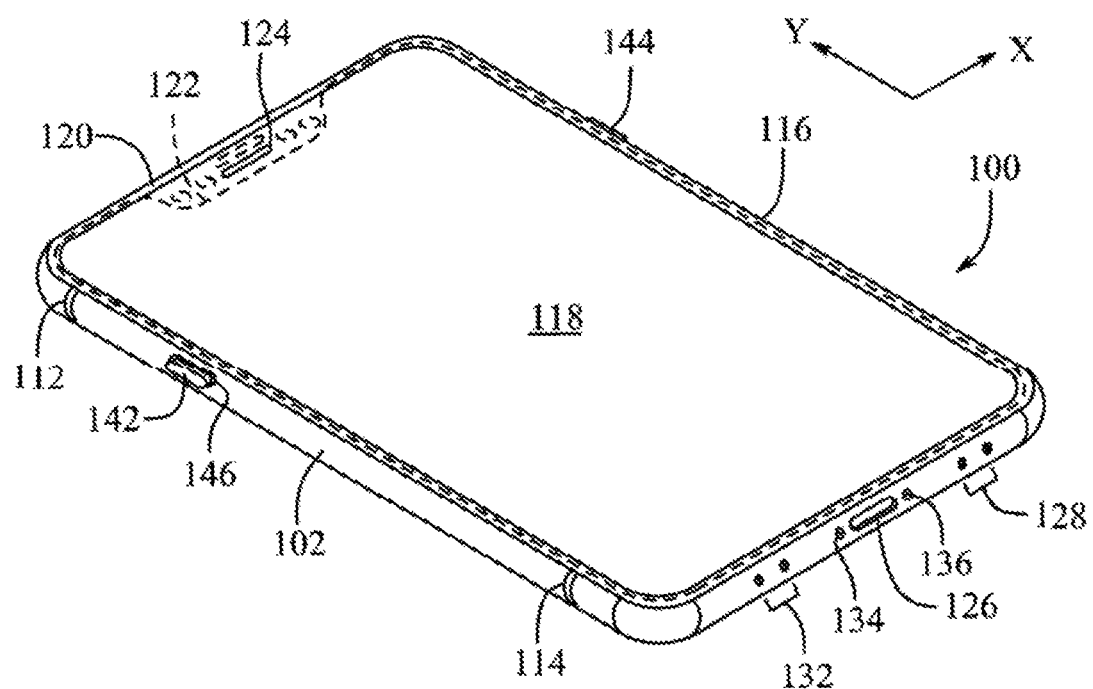
FIG. 1 shows a perspective view on an electronic device.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments, as defined by the appended claims.

The following disclosure relates to electronic devices with improved robustness and durability. The electronic devices described herein offer several enhancements over traditional devices. For example, the electronic devices as described herein can include shock absorbing filler materials that protect sensitive components, such as display layers and display integrated circuits, from drop and impact stresses.

The electronic devices described herein can be mobile wireless communication devices, such as a smartphones or smartwatches. In a particular example, an electronic device can include a housing that defines an aperture. The housing can include a display frame defining an interior portion of the housing and a device enclosure defining an exterior portion of the housing. The display frame can be attached to internal electronic components of the electronic device, such as a display assembly. The device enclosure can surround and can be secured to the display frame. In some examples, the display frame and/or device enclosure can be made from a composite of metal and plastic, such as steel and plastic.

A display assembly can be positioned in the aperture defined by the frame such that the housing borders or rings a periphery of the display component. In some examples, the display assembly can include a display panel or layer that includes a liquid crystal display ("LCD") that relies upon backlighting to present the visual information. In some examples, the display layer includes an organic light emitted diode ("OLED") display designed to selectively illuminate individual pixels.

The display layer can be bent or folded to define a bend region or a panel bend. The panel bend can define a curved surface or portion of the display panel. The bend region can define a first curved surface and a second curved surface opposite the first curved surface. As described herein, a potting material can be disposed in the first curved surface to improve the robustness of the panel bend region. In some examples, a strain-neutralization layer can be included on an exterior of the display layer, opposite the bend volume, such that the display layer is positioned between the strain-neutralization layer and the potting material.

The display layer can have an active area and a tail portion bending adjacent the active area, with bend region connecting or bridging the active area and the tail portion. In some examples, a display integrated circuit can be coupled or attached to the display layer, specifically to the tail portion of the display layer. The display integrated circuit can be attached to the tail portion by any number of adhesives, fasteners, engagement features, or any other suitable securing system, material, or components. As described herein, various support materials can be used to improve the robustness of the electronic device, specifically by protecting the bend region and the display integrated circuit.

The support materials described herein can act as stiffening or shock absorbing materials to improve the robustness of the electronic device, and specifically, to protect, isolate, and or reduce the exposure of the display layer, the panel bend region, and the display integrated circuit from impacts or stress.

In some examples, at least one of the support materials is in direct physical contact with a display component, such as the display layer. In some examples, a support material is in direct physical contact with the housing. In some examples, a support material is in direct physical contact with the display integrated circuit. In some examples, a support material is in direct physical contact with the display component and the housing.

The support materials can include at least a stiffener plate, foam, and potting material. For example, the stiffener plate can be positioned in-plane with the display integrated circuit and have a thickness of about 50 microns to about 90 microns. A stiffener plate can be positioned between an active region of the display assembly and the tail portion. In some examples, a potting compound at least partially surrounds the display integrated circuit. Further, foam can be deposited at various locations, for instance, shock absorbent foam can be positioned between the display integrated circuit and an internal enclosure. Foam can also be placed between the display layer and the internal enclosure and between an active region of the display layer and the tail portion.

These and other embodiments are discussed below with reference to FIGS. 1-13. However, those skilled in the art will readily appreciate that the detailed description given herein with respect to these Figures is for explanatory purposes only and should not be construed as limiting.

FIG. 1 illustrates a perspective view of an embodiment of an electronic device 100. The electronic device 100 shown in FIG. 1 is a mobile wireless communication device, such as a smartphone. The smartphone of FIG. 1 is merely one representative example of a device that can be used in conjunction with the systems and methods disclosed herein. Electronic device 100 can correspond to any form of wearable electronic device, a portable media player, a media storage device, a portable digital assistant ("PDA"), a tablet computer, a computer, a mobile communication device, a GPS unit, a remote control device, or other electronic device. The electronic device 100 can be referred to as an electronic device, a consumer device, or simply as a device.

The electronic device 100 can have a housing that includes a band 102 that defines an outer perimeter of the electronic device 100. The band 102, or portions thereof, can be formed using additive manufacturing processes or can be machined. In some examples, the band 102 can define one or more sidewall components of the electronic device 100. In some examples, the band 102 defines a non-continuous perimeter of the electronic device 100. That is, the band 102 can be formed with gaps or spaces therein.

In some examples, the band 102 includes an antenna assembly (not shown in FIG. 1). As a result, a non-metal material, or materials, can separate the sidewall components of the band 102 from each other in order to electrically isolate the sidewall components. For example, separating materials 112, 114 can be position between sections of the band 102. The aforementioned materials can include an electrically inert, or insulating, material(s), such as plastics and/or resin, as non-limiting examples. As discussed in greater detail below, the separating materials 112, 114 can be formed using similar manufacturing techniques as the band 102. For instance, the separating materials 112, 114 can be formed using an additive manufacturing process.

The electronic device 100 can further include a display assembly 116 (shown as a dotted line) that is covered by a protective cover 118. The display assembly 116 can include multiple layers, with each layer providing a unique function. The display assembly 116 can be partially covered by a border 120 that extends along an outer edge of the protective cover 118 and partially covers an outer edge of the display assembly 116. In some examples, the border 120 can be a portion of the band 102, being formed along with the band 102. The border 120 can be positioned to hide or obscure any electrical and mechanical connections between the layers of the display assembly 116 and flexible circuit connectors. Also, the border 120 can exhibit a uniform thickness. For example, the border 120 can include a thickness that generally does not change in the X- and Y-dimensions.

Also, as shown in FIG. 1, the display assembly 116 can include a notch 122, representing an absence of the display assembly 116. The notch 122 can allow for a vision system that provides the electronic device 100 with information for object recognition, such as facial recognition. In this regard, the electronic device 100 can include a masking layer with openings (shown as dotted lines) designed to hide or obscure the vision system, while the openings allow the vision system to provide the object recognition information. Also, the protective cover 118 can be formed from a transparent material, such as glass, plastic, sapphire, or similar transparent materials. In this regard, the protective cover 118 can be referred to as a transparent cover, a transparent protective cover, or a cover glass (when the protective cover 118 includes glass). As shown in FIG. 1, the protective cover 118 can include an opening 124, which can represent a single opening of the protective cover 118. The opening 124 can allow for transmission of acoustical energy (in the form of audible sound) into the electronic device 100, which can be received by a microphone (not shown in FIG. 1) of the electronic device 100. Further, the opening 124 can allow for transmission of acoustical energy (in the form of audible sound) out of the electronic device 100, which can be generated by an audio module (not shown in FIG. 1) of the electronic device 100.

In some examples, the band 102 can define a port 126 designed to receive a connector of a cable assembly. The port 126 allows the electronic device 100 to communication data information (send and receive), and also allows the electronic device 100 to receive electrical energy to charge a battery assembly. Accordingly, the port 126 can include terminals that electrically couple to the connector. The port 126 can be formed as part of the additive manufacturing process to form the band 102 or can be formed by subsequent processing.

Furthermore, the band 102 can define several openings. For example, the band 102 can define openings 128 that allow an additional audio module (not shown in FIG. 1) of the electronic device to emit acoustical energy out of the electronic device 100. The band 102 can further define openings 132 that allow a microphone of the electronic device to receive acoustical energy. The band 102 can define holes to receive fasteners. For instance, the electronic device 100 can also include a first fastener 134 and a second fastener 136 designed to be fastened to a rail that is coupled to the protective cover 118. In this way, the first fastener 134 and the second fastener 136 can be designed to couple the protective cover 118 with the band 102. As discussed in greater detail below, the band 102 can define holes for injecting an encapsulant or filler material between the band 102 and the display assembly 116. These various openings can be formed as part of a 3D printing process in conjunction with formation of the band 102. In some examples, the openings are machined into the band 102 after the band 102 has been formed.

The electronic device 100 can include several control inputs designed to provide a command to the electronic device 100. For example, the electronic device 100 can include a first control input 142 and a second control input 144. The aforementioned control inputs can be used to adjust the visual information presented on the display assembly 116, and/or the volume of acoustical energy output by an audio module, as non-limiting examples. The controls can include one of a switch, a sensor, or a button designed to generate a command to a processor circuit. The control inputs can at least partially extend through openings in the sidewall components. For example, the second sidewall component 106 can include an opening 146 that receives the first control input 142. Further details of the electronic device 100 are provided below with reference to FIG. 2.

Figure 2:
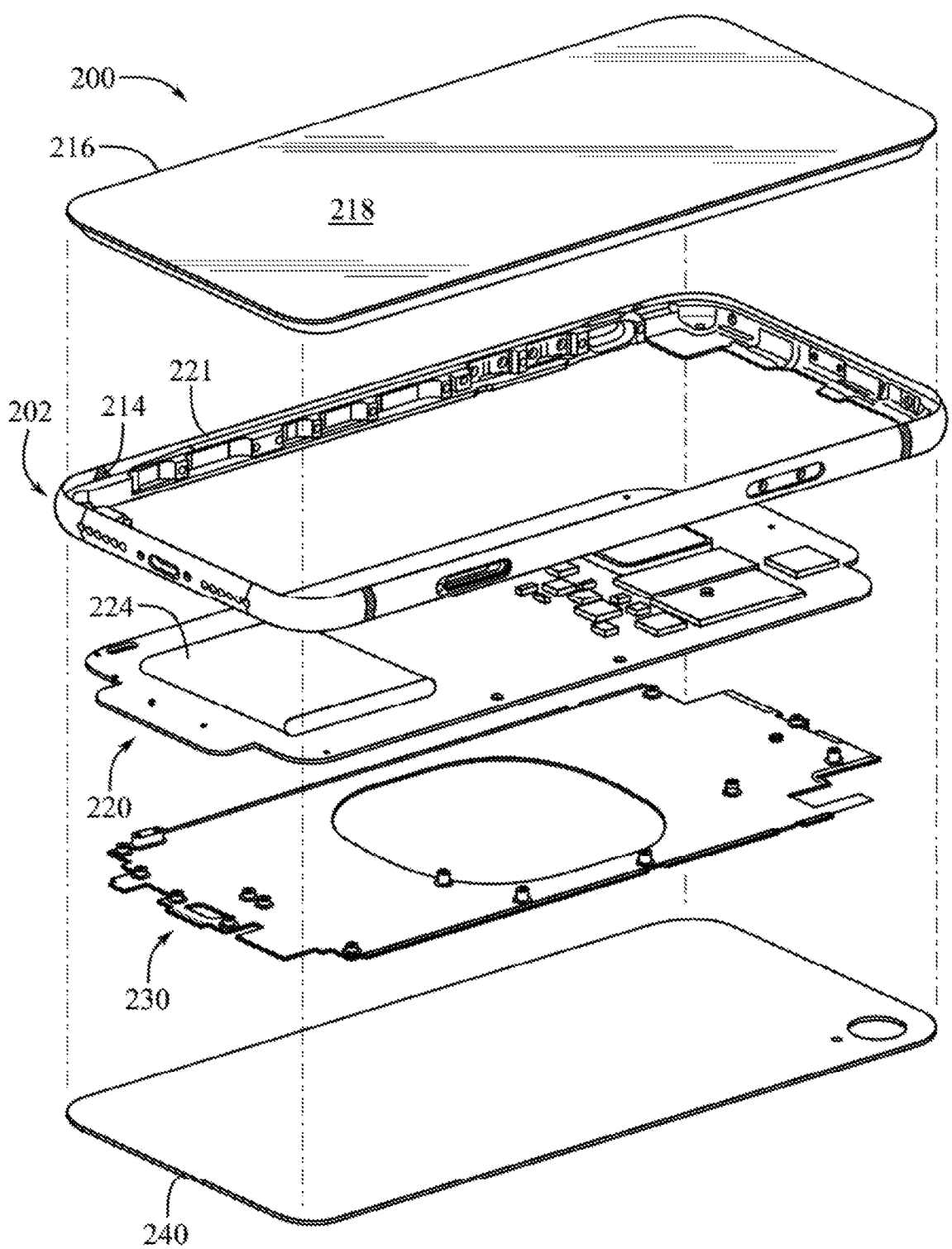
FIG. 2 shows an exploded view of an electronic device.

FIG. 2 illustrates an exploded view of an electronic device 200. The electronic device 200 can be substantially similar to, and can include some or all of the features of any of the electronic devices discussed herein, such as electronic device 100. As shown, the band 202 at least partially defines an exterior portion, such as an outer perimeter of the electronic device. The band 202, can include one or more features to receive or couple to other components of the device 200, such as feature 221. For example, the band 202 can include any number of features such as apertures, cavities, indentations, bosses, protrusions, and other mating features configured to receive and/or attach to one or more components of the device 200. In some examples, the feature 221 can be printed onto the band 202 by an additive manufacturing process, as described herein. Further, in some examples, the feature 221 can include a metallic material different than the metallic material of the band 202. In some examples, both the band 202 and feature 221 can be formed by one or more additive manufacturing processes. In some examples, as with the band 102, the band 202 can include multiple portions that can be electrically isolated from one another by a separating material 214.

The electronic device 200 can include a display assembly 216 that is covered by a protective cover 218. The display assembly 216 can include multiple layers, with each layer providing a unique function, and can include a frame (not shown) that can serve to fix, join, or attach the display assembly to the band 202, as described further herein.

The electronic device 200 can include internal components such as processors, memory, circuit boards, batteries, and sensors. Such components can be disposed within an internal volume defined, at least partially, by the band 202, and can be affixed to the band 202, via internal surfaces, attachment features such as feature 221, threaded connectors, studs, posts, and/or other fixing features, that are formed into, defined by, or otherwise part of the band 202.

The device 200 can include internal components, such as a system in package (SiP), including one or more integrated circuits such as a processors, sensors, and memory. The device 200 can also include a battery 224 housed in the internal volume of the device 200. The device 200 can also include one or more sensors, such as optical or other sensors, that can sense or otherwise detect information regarding the environment exterior to the internal volume of the device 200. Additional components, such as a haptic engine, can also be included in the device 200. In some examples, the display assembly 216 can be received by and/or attached to the band 202 by one or more attachment features.

The electronic device 200 can further include a chassis 220 that can provide structural support. The chassis 220 can include a rigid material, such as a metal, or can include a composite construction. The chassis 220 can also be coupled to the band 202. In this manner, the chassis 220 can provide an electrical grounding path for components electrically coupled to the chassis. The electronic device can alternatively or additionally include a back plate 230 having cladding layers and/or other attachment features such that one or more components of the electronic device 200 can be attached to the back plate 230, for example, via welding. The back plate 230 can form conductive pathways for connecting components of the electronic device 200. In some examples, the back plate 230 can be attached to the band 202 of the device 200 by one or more attachment features. In some examples, the band 202, the chassis 220, and the back plate 230 are jointed together after individual manufacture, or they can be integrally formed with one another in any combination as a sectioned element by an additive manufacturing process.

An exterior surface of the electronic device 200 can further be defined by a back cover 240 that can be coupled with the band 202. In this regard, the back cover 240 can combine with the band 202 to form an enclosure or a housing of the electronic device 200, with the enclosure or housing (including band 202 and back cover 240) at least partially defining an internal volume. The back cover 240 can include a transparent material, such as glass, plastic, sapphire, or another transparent material. As discussed below, the back cover 240 can be formed together with the band 202 using any number of manufacturing methods, including additive manufacturing processes.

The housing, including the band 202, can be conformable to interior dimensional requirements, as defined by the internal components. For example, the structure of the housing including a band 202 can be defined or limited exclusively or primarily by the internal components the housing is designed to accommodate. That is, because a housing including a band 202 can be extremely light and strong, the housing can be shaped to house the interior components in a dimensionally efficient manner without being constrained by factors other than the dimensions of the components, such as the need for additional structural elements. In some examples, these formation processes discussed herein can allow for the housing and/or band 202 to have a detailed shape or design that is tailored specifically to satisfy one or more needs, such as internal dimensional requirements, without the need for additional features to reinforce the structure of the housing. Additionally, artifacts of the manufacturing process of the housing can be eliminated. Further details of the electronic devices are provided below with reference to FIG. 3.

Figure 3:
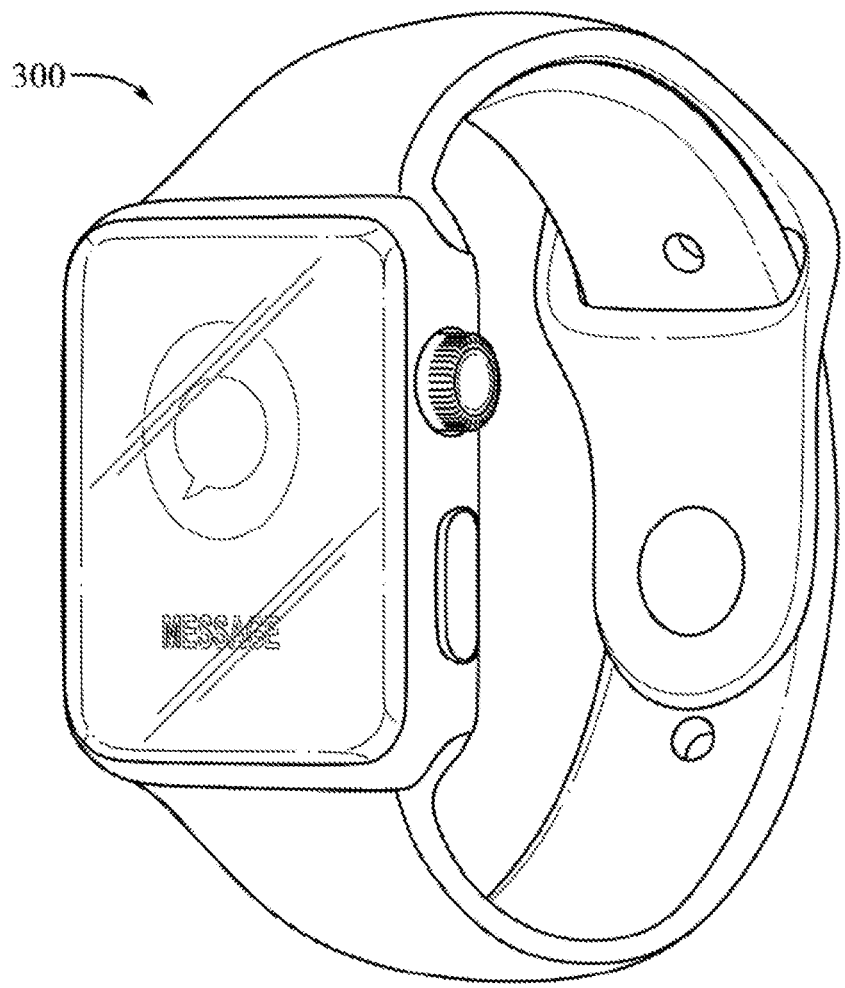
FIG. 3 shows a perspective view of an electronic device.

FIG. 3 shows another example of an electronic device 300. The electronic device shown in FIG. 3 is a watch, such as a smartwatch. The smartwatch 300 of FIG. 3 is merely one representative example of a device that can be used in conjunction with the components and methods disclosed herein. As described with respect to electronic device 100, electronic device 300 can correspond to any form of wearable electronic device, a portable media player, a media storage device, a portable digital assistant ("PDA"), a tablet computer, a computer, a mobile communication device, a GPS unit, a remote control device, and other devices. The electronic device 300 can be referred to as an electronic device, or a consumer device. Further details of a watch are provided below with reference to FIG. 4.

Figure 4:
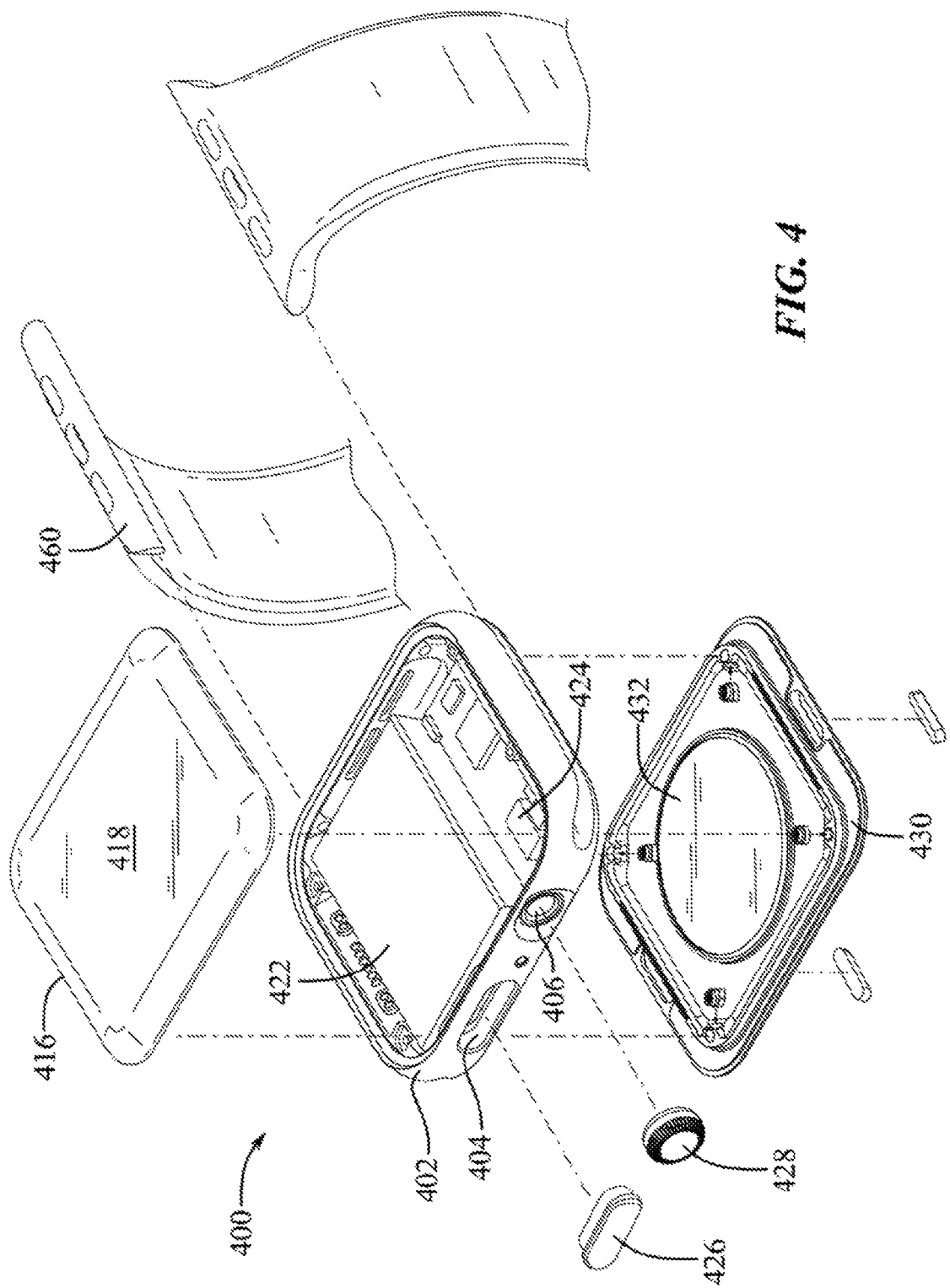
FIG. 4 shows an exploded view of an electronic device.

Referring now to FIG. 4, the electronic device 400 can include a housing 402, and a cover 418 attached to the housing. The housing 402 can substantially define at least a portion of an exterior surface of the device 400. The cover 418 can include glass, plastic, or any other substantially transparent material, component, or assembly. Although in some examples, the cover 418 can include a material or materials that are not transparent. The cover 418 can cover or otherwise overlay a display assembly 416. The display assembly 416 can include multiple layers, with each layer providing a unique function. Accordingly, the cover 418 can be, or be a part of, an interface component. The cover 418 can define a front exterior surface of the device 400 and, as described herein, this exterior surface can be considered an interface surface. In some examples, the interface surface defined by the cover 418 can receive inputs, such as touch inputs, from a user.

A back cover 430 can also be attached to the housing 402, for example, opposite the cover 418. The back cover 430 can include ceramic, plastic, metal, or combinations thereof. In some examples, the back cover 430 can include an electromagnetically transparent portion 432. The electromagnetically transparent portion 432 can be transparent to any desired wavelength of electromagnetic radiation, such as visible light, infrared light, radio waves, or combinations thereof. Together, the housing 402, cover 418 and back cover 430 can substantially define an internal volume and external surface of the device 400.

The housing 402 can be a substantially continuous or unitary component, and can include one or more openings 404, 406 to receive components of the electronic device 400 and/or to provide access to an internal portion of the electronic device 400. In some examples, the device 400 can include input components such as one or more buttons 426 and/or a crown 428 that can be disposed in the openings 404, 406. In some examples, a material can be disposed between the buttons 426 and/or crown 428 and the housing 402 to provide an airtight and/or watertight seal at the locations of the openings 404, 406. As discussed in greater detail below, the housing 402 can define holes for injecting an encapsulant or filler material between the housing 402 and the display assembly 416.

The electronic device 400 can further include a strap 460, or another component designed to attach the device 400 to a user, or to provide wearable functionality. In some examples, the strap 460 can be a flexible material that can comfortably allow the device 400 to be retained on a user's body at a desired location. Further, the housing 402 can include a feature or features that can provide attachment locations for the strap 460. In some examples, the strap 460 can be retained on the housing 402 by any desired techniques. For example, the strap 460 can include any combination of magnets that are attracted to magnets disposed within the housing 402, and/or retention components that mechanically retain the strap 460 against the housing 402.

The device 400 can also include internal components, such as a haptic engine 424, a battery 422, and a system in package (SiP), including one or more integrated circuits, such as processors, sensors, and memory. The SiP can also include a package. The internal components, such as one or more of components 422, 424 can be disposed within the internal volume defined at least partially by the housing 402, and can be affixed to the housing 402 via internal surfaces, attachment features, threaded connectors, studs, posts, or other features, that are formed into, defined by, or otherwise part of the housing 402 and/or the cover 418 and/or back cover 430.

Figure 5:
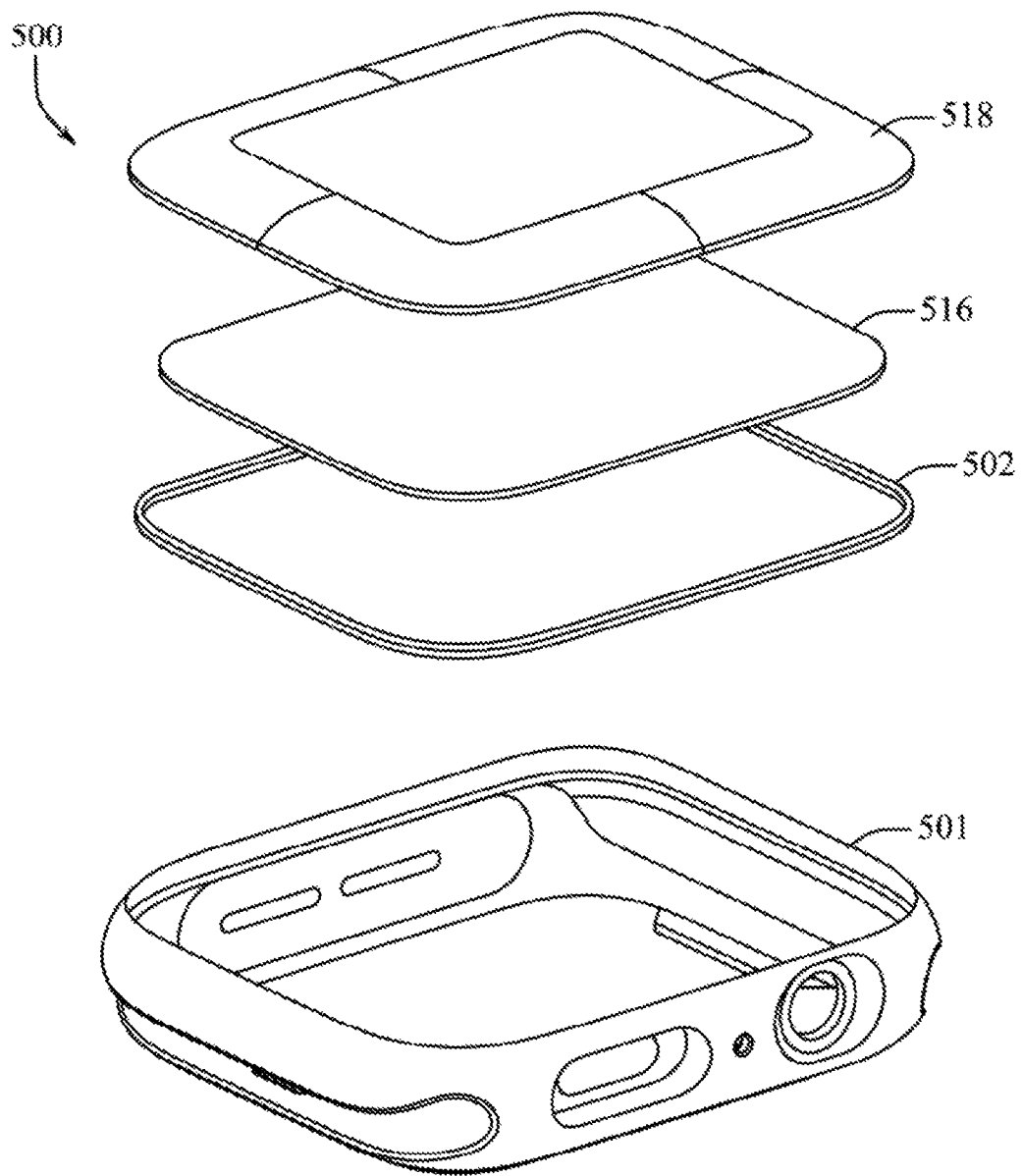
FIG. 5 shows an isolated perspective view of components of an electronic device.

FIG. 5 shows an exploded view of an electronic device 500 including a display assembly 516, a cover 518, a frame 502, and a housing 501. The electronic device 500 can be substantially similar to, and can include some or all of the features of any of the electronic devices discussed herein, such as electronic devices 100, 200, 300, and 400. Various components of the electronic device 500 have been removed for clarity. In some examples, the display assembly 516 can be attached to the frame 502 by various attachment systems, materials, or mechanisms, such as adhesion, welding, or mechanical attachment. In some examples, the frame 502 be made from a composite of steel and plastic. The frame 502 can act as an interface between the display assembly 516 and an outer shell or housing 501. In this manner, the frame 502 can act as a protective barrier to the periphery of the display assembly 516.

Any number or variety of components in any of the configurations described herein can be included in the input device. The components can include any combination of the features described herein and can be arranged in any of the various configurations described herein. The structure and arrangement of components of an input device having a housing with structures described herein, and defining an internal volume, as well as the concepts regarding input components, filler materials, and display assemblies, can apply not only to the specific examples discussed herein, but to any number of examples in any combination. Various examples of electronic devices including components having various features in various arrangements are described below, with reference to FIGS. 6-13.

Figure 6:
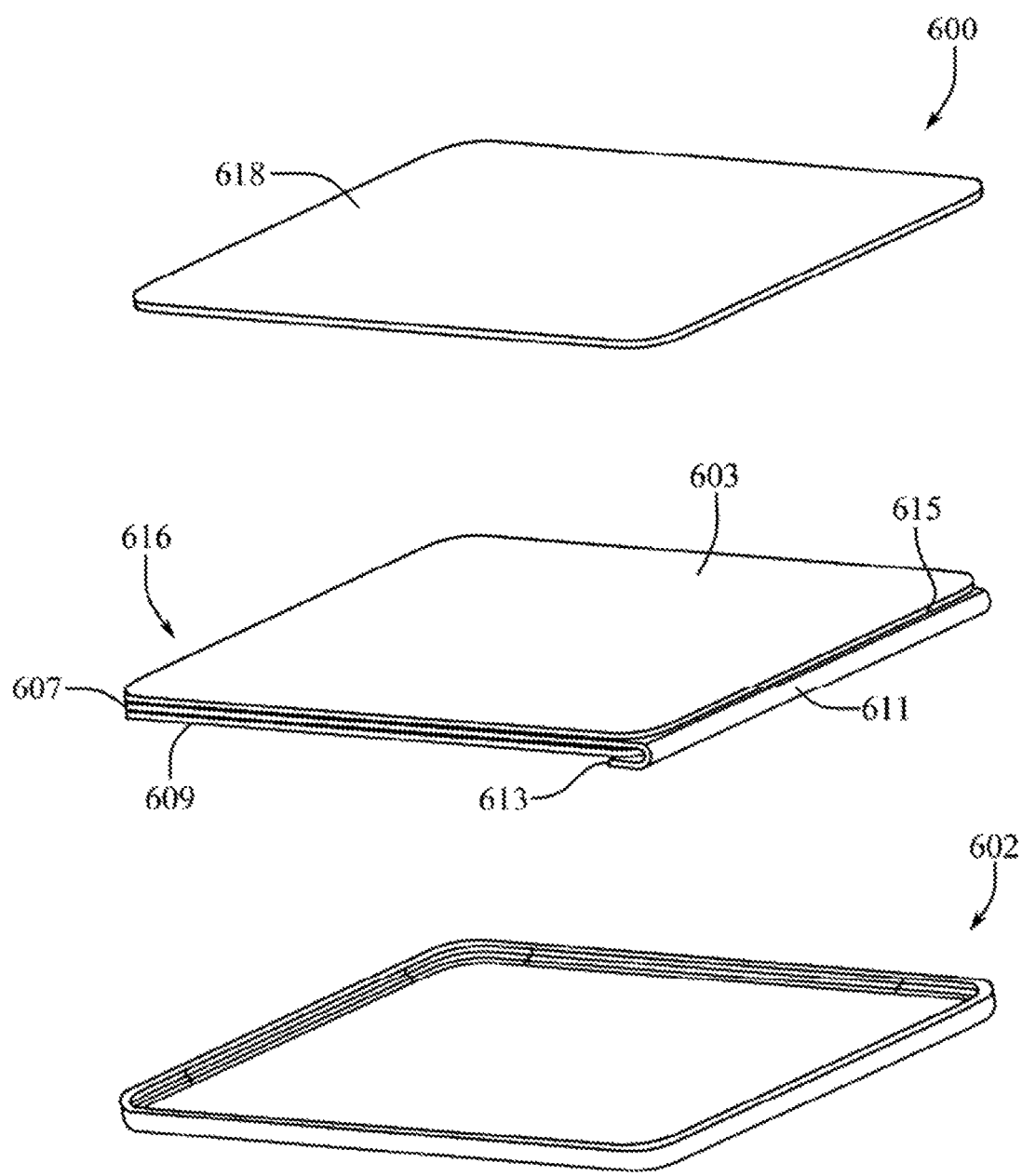
FIG. 6 shows a partially exploded view of a display assembly.

FIG. 6 illustrates a partial exploded view of an electronic device 600. The electronic device 600 can be substantially similar to, and can include some or all of the features of the electronic devices discussed herein, such as electronic devices 100-300. Several features of the electronic device 600 are not shown for simplicity. A first protective layer 618, such as a cover glass, can overlay a display assembly 616. The first protective layer 618 can be adhesively secured to the display assembly 616 with an adhesive layer (not shown) or by any other desired technique.

The display assembly 616 can include a touch sensitive layer 603 designed to receive a touch input, a display layer 607 designed to present visual information, and a force sensitive layer 609 designed to detect an amount of force applied to, or exerted on, the display layer 607 by way a force applied to at least one of the first protective layer 618, the touch sensitive layer 603, and the display layer 607. Although not shown, the display assembly 616 can include adhesive layers to adhesively secure the touch sensitive layer 603 with the display layer 607, and to adhesively secure the display layer 607 with the force sensitive layer 609.

The touch sensitive layer 603 is designed to receive a touch input when, for example, a user can exert pressure the first protective layer 618. The touch sensitive layer 603 can include capacitive touch-sensitive technology. For example, the touch sensitive layer 603 can include a layer of capacitive material that holds an electrical charge. The layer of capacitive material is designed to form a part of multiple capacitive parallel plates throughout a location corresponding to the display layer 607. In this regard, when a user touches the first protective layer 618, the user forms one or more capacitors. Moreover, the user causes a volt drop across the one or more capacitors, which in turns causes the electrical charge of the capacitive material to change at a specific point (or points) of contact corresponding to a location of the user's touch input. The capacitance change and/or voltage drop can be measured by the electronic device 600 to determine the location of the touch input. The touch sensitive layer 603 can include an edge region 615. The edge region 615 can include electrical connectors.

In some examples, the display layer 607 includes a liquid crystal display ("LCD") that relies upon backlighting to present the visual information. In the embodiment shown in FIG. 6, the display layer 607 includes a light emitting diode (LED) and/or organic light emitted diode ("OLED") display designed to illuminate individual pixels, when needed. When the display layer 607 includes OLED technology, the display layer 607 can include a reduced form factor as compared to that of an LCD display. In this regard, the display assembly 616 can include a smaller footprint and/or thickness, thereby creating more space for other components in the internal volume, such as a battery assembly. In some examples, the display layer 607 can be curved or bent without causing damage to the display layer 607. For example, as shown in FIG. 6, the display layer 607 includes or defines a bend or a bend region 611. The bend region 611 can be a 180-degree bend, or approximately a 180-degree bend. In some examples, the bend 611 can be at any angle and/or radius of curvature as desired, and can be at least about a 90-degree bend, at least about a 120-degree bend, at least about a 135-degree bend, at least about a 150-degree bend, at least about a 180-degree bend, at least about a 220-degree bend, at least about a 235-degree bend, or at least about a 270-degree bend or more. In some examples, the bend 611 allows the display layer 607 to bend or curve around at least a portion of the force sensitive layer 609, as shown in FIG. 6. In some examples, the bend 611 can extend along a length or a width of the electronic device. In some examples, the display layer 607 includes multiple bends 611 on various edges of the display layer 607. For example, the display layer 607 can define two bends on opposing ends of the display layer 607 that run along substantially all of a length of the electronic device 600.

The display layer 607 can include an edge region or tail portion 613 that includes a connector (not shown) used to electrically and mechanically couple the display layer 607 with a flexible circuit (not shown) that electrically couples with a circuit board assembly (shown below), with flexible circuit placing the display layer 607 in communication with the circuit board assembly. In some examples, the display layer 607 can include an active matrix organic light emitting diode ("AMOLED") display. The edge region 615 of the touch sensitive layer 603 can be parallel, or at least substantially parallel, with respect to the edge region or tail portion 613 of the display layer 607, even when the display layer 607 includes the bend 611.

The force sensitive layer 609 can operate by determining an amount of force or pressure applied to the first protective layer 618, the touch sensitive layer 603, and/or the display layer 607. In this regard, the force sensitive layer 609 can distinguish between different amounts of force applied to the electronic device 100. The different amounts of force can correspond to different user inputs. The force sensitive layer 609 can include multiple parallel capacitor plate arrangements, with one plate of each capacitor plate arrangement having an electrical charge. When a force to the first protective layer 618 causes the distance between one or more pairs of parallel plate capacitors to reduce, a change in capacitance between the one or more pairs of parallel plate capacitors can occur. The amount of change in capacitance corresponds to an amount of force exerted on the first protective layer 618.

Further, in order to support the first protective layer 618 and the display assembly 616, and facilitate assembly of the first protective layer 618 and the display assembly 616, the electronic device 600 can include a frame 602 that receives and secures with the first protective layer 618 and display assembly 616. Accordingly, the frame 602 can include a size and shape in accordance with that of the first protective layer 618 and/or the display assembly 616. In some examples, the frame 602 can at least partially define an exterior surface of the electronic device 600. In some examples the electronic device 600 further includes a band or a housing (not shown in FIG. 6) that defines an exterior shell or surface of the electronic device 600 and couples to the frame 602. The frame 602 can be formed from a polymeric material, such as plastic, and can also include a metal ring (not shown) that is partially embedded in the polymeric material during an insert molding operation. In this regard, the frame 602 can structurally support the first protective layer 618, as well as one or more components of the display assembly 616. Further details of a display assembly are provided below with reference to FIG. 7.

Figure 7:
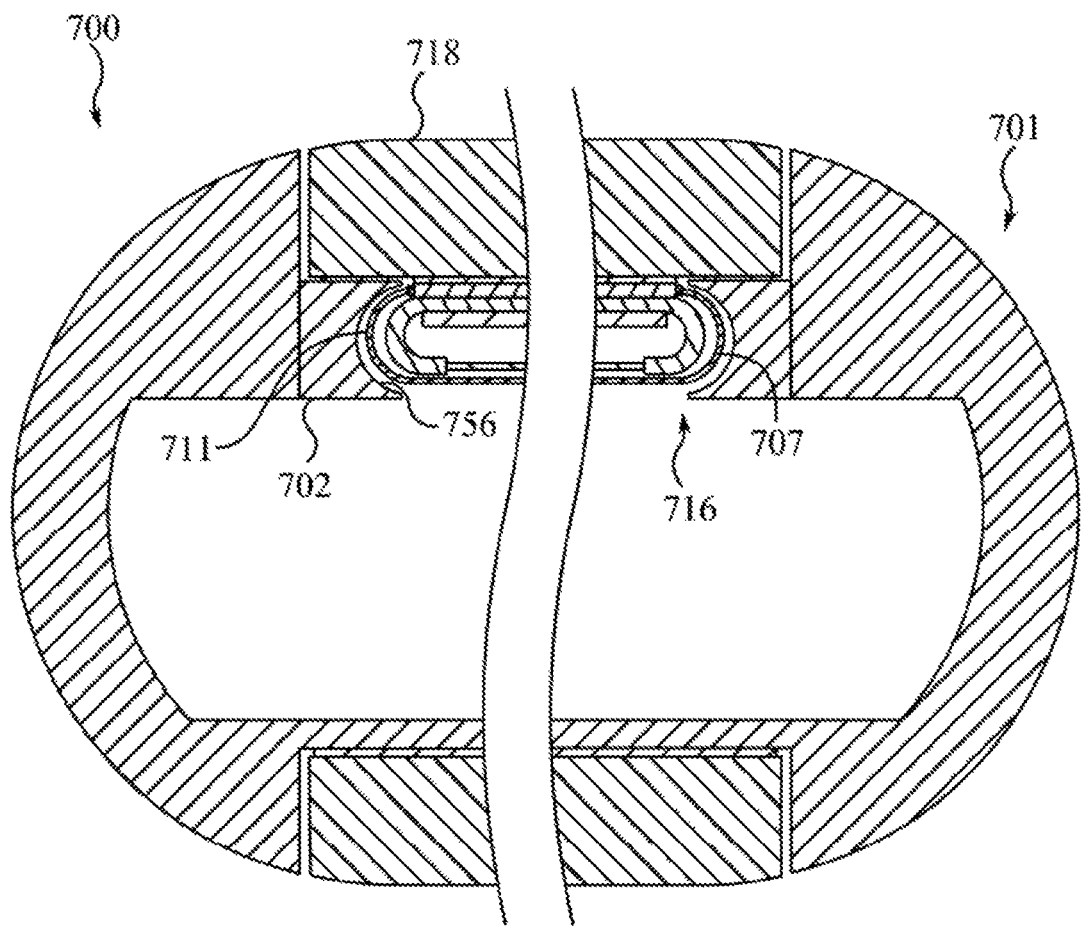
FIG. 7 shows a side cross-sectional view of an electronic device.

FIG. 7 illustrates a cross-sectional view of an example of an electronic device 700, showing the electronic device 700 with a housing 701 and a frame 702 coupled with the housing 701. The electronic device 700 can be substantially similar to, and can include some or all of the features of the electronic devices discussed herein, such as electronic devices 100-600. Several features of the electronic device 700 are not shown for simplicity. In some examples, the frame 702 is integrally formed with the housing 701. The housing 701 can be formed from a metal, such as aluminum or an alloy that includes aluminum. In some examples, the housing 701 is a ceramic. A ceramic material can provide a robust enclosure while also minimizing the effects of RF interference with an antenna assembly (not shown) of the electronic device 700.

The housing 701 and/or frame 702 can receive and support a protective cover 718. In some examples, the frame 702 includes a notch or a groove 756 designed to receive bending regions 711 of a display assembly 716. The notch 756 can extend circumferentially around the display assembly 716. In some examples, the notch 756 is designed to run parallel with the bend regions 711 of the display assembly 716, and/or have a shape corresponding thereto. The bend 711 can extend along a length or width of the electronic device 700. In some examples, the display assembly 716 includes multiple bends 711. For example, the display layer 707 can define two bends or bend regions on opposing ends of the display layer 707 that run along substantially all of a length of the electronic device 700. Further details of the display assembly are discussed below with reference to FIG. 8.

Figure 8:
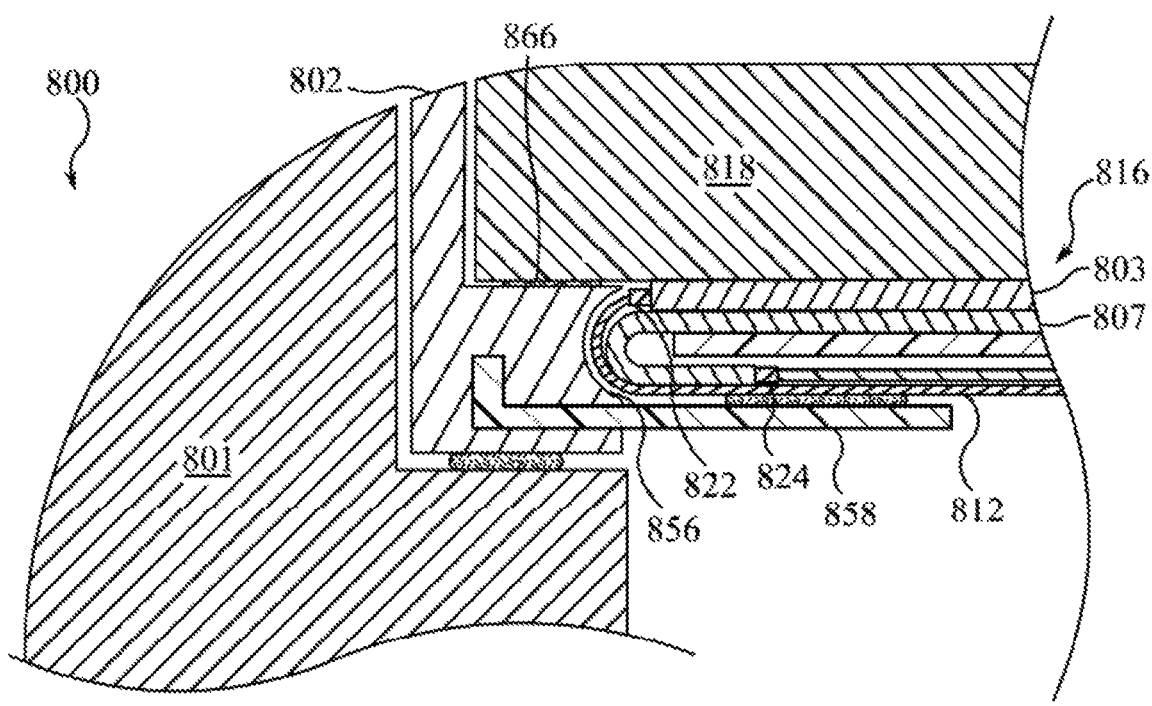
FIG. 8 shows a side cross-sectional view of an electronic device.

FIG. 8 illustrates a cross-sectional view of the electronic device 800 including a display assembly 816. The electronic device 800 can be substantially similar to, and can include some or all of the features of the electronic devices discussed herein, such as electronic devices 100-700. Several features of the electronic device 800 are not shown for simplicity. Although not shown, the display assembly 816 can include adhesive layers to adhesively secure various layers and components of the display assembly 816 to one another and/or to other components of the device 800.

A connector 822 can be located on an edge region that can be substantially similar to the edge region 415 shown in FIG. 4. As described above, a display layer 807 can bend or curve to define a bend region and a tail portion. Further, a first flexible circuit 812 can bend or curve around the display layer 807.

A frame 802 can be secured to a housing 801 and can include design considerations that accommodate the display assembly 816. For example, the frame 802 can include a notch 856, or an undercut region, designed to at least partially receive the first flexible circuit 812 and/or the display layer 807. As shown in FIG. 8, the notch 856 includes a size and shape to receive a bent/curved region of both the display layer 807 as well the first flexible circuit 812. While the notch 856 includes a curvature generally corresponding to that of the first flexible circuit 812 and the display layer 807, other shapes, including straight edges, are possible for the notch 856. Also, the notch 856 can be formed during a molding operation of the frame 802. Alternatively, the notch 856 can be formed subsequent to a molding or other formation operation by, for example, by a subtractive manufacturing process, such as a cutting operation.

In some examples, the frame 802 is adhesively secured with the first protective layer 818 by adhesive 866. In some examples, the frame 802 can include a supporting element 858 partially embedded in the frame 802. The supporting element 858 includes a ring formed from a metal material that continuously or non-continuously extends around the display assembly 816 in accordance with the frame 802. In some examples, the supporting element 858 is discontinuous, and is selectively embedded in the frame 802. As shown, the supporting element 858 can extend along the frame 802 to support the display assembly 816 and the first protective layer 818. Also, the first flexible circuit 812 can be adhesively secured with the supporting element 858 by an adhesive layer.

FIG. 8 further shows some components of the display assembly 816 coupled with the flexible circuits at one location while other components are not. For example, the touch sensitive layer 803 is electrically and mechanically coupled with the first flexible circuit 812 by the connector 822, and the display layer 807 is electrically and mechanically coupled with a second flexible circuit 812 by a connector 824, with the connector 822 and the connector 824. Further details of a display assembly are discussed below with reference to FIG. 9.

Figure 9:
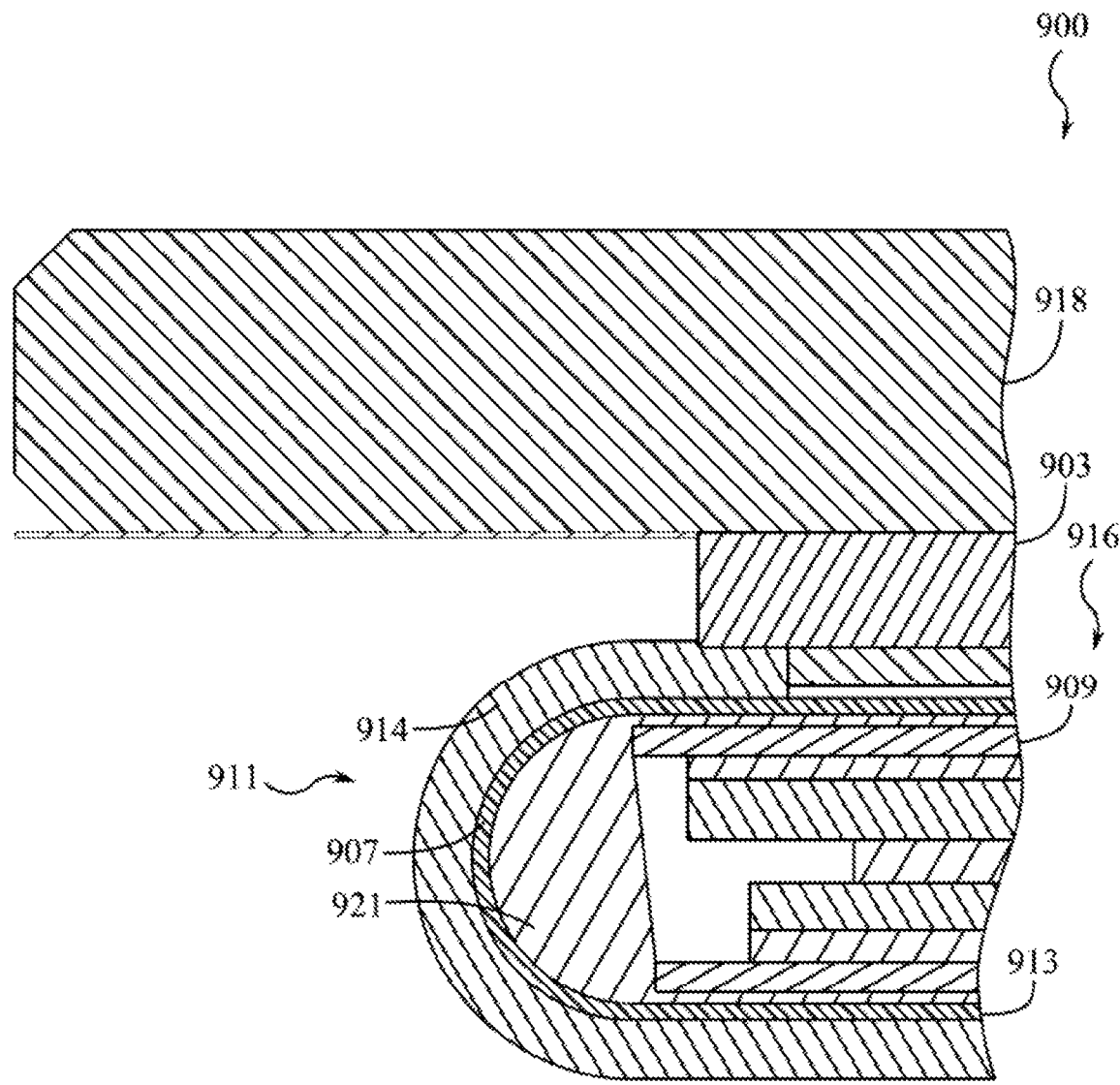
FIG. 9 shows a side cross-sectional view of an electronic device.

FIG. 9 illustrates a side cross-sectional view of an electronic device 900. The electronic device 900 can be substantially similar to, and can include some or all of the features of any of the electronic devices discussed herein, such as electronic devices 100-800.

Similar to other examples described herein, the electronic device 900 can include a display assembly 916 that includes a touch sensitive layer 903 designed to receive a touch input, a display layer 907 designed to present visual information, and a force sensitive layer 909 designed to detect an amount of force applied to, or exerted on, at least one of the touch sensitive layer 903, the display layer 907, or a protective cover 918 that overlays the display assembly 916.

The display layer 907 can extend beyond the force sensitive layer 909 and can define a bend or a bend region 911 that connects to a tail portion 913. The electronic device 900 can further include a potting material 921 in contact with a surface of the display layer 907. The potting material 921 can support the display layer 907. Specifically, the potting material 921 can reinforce or bolster the bend 911 of the display layer 907, against external forces or stresses. In order to supply the first material 921, a needle (not shown) can be inserted into a location within the bend region of the display layer 907. The needle or other deposition component can disperse the material while being pulled out of the electronic device 900. In some examples, the potting material 921 is injected from both open ends of the bend 911.

The potting material 921 can have a modulus of about 180 megapascals to about 300 megapascals, or of about 200 megapascals to about 290 megapascals. In some examples, the potting material 921 can have a modulus of about 500 to about 800 megapascals. The potting material 921 can be similar to Henkel 25t-10 or 25t-31/32. In some examples, the display assembly 916 includes a strain-neutralization layer (SNL) 914 disposed on and/or in contact with an exterior surface of the bend 911, such that the bend 911 is positioned between the strain-neutralization layer 914 and the potting material 921. In some examples, the strain-neutralization layer 914 covers a region of the tail portion 913 and/or some of the display panel 907 before the bend 911. The strain-neutralization layer 914 can include a polymeric material, and in some examples, can be an epoxy.

In some examples, the potting material 921 can be formulated to adhere and/or bond to the material or materials including the display layer 907. For example, the potting material 921 can adhere and/or bond to a polymeric material, such as polyimide. The potting material 921 can be configured to adhere to at least metallic materials such as stainless steel, composite materials such as glass-filled nylon, polymeric materials such as acrylic, and/or pressure sensitive adhesives. In some examples, the potting material 921 can be provided to a desired location in a moldable or flowable form and then hardened or cured as desired. In some examples, any curing or hardening techniques can be used as desired. In some examples, the potting material 921 can thus include a curable material, such as a curable polymer. In some examples, the potting material 921 is an ultraviolet light and/or moisture curable polymer.

When depositing the potting material 921, it can be advantageous to nominally fill some or all of the bend region with the potting material 921 to avoid the potting material 921 behaving like rigid body that can undesirably transfer forces to the display assembly 916. Therefore, the potting material 921 can defined one or more gaps or open volumes, for example to avoid direct translation of forces. Gaps around the potting material 921 can also be utilized to provide moisture to cure the potting material 921.

Figure 10:
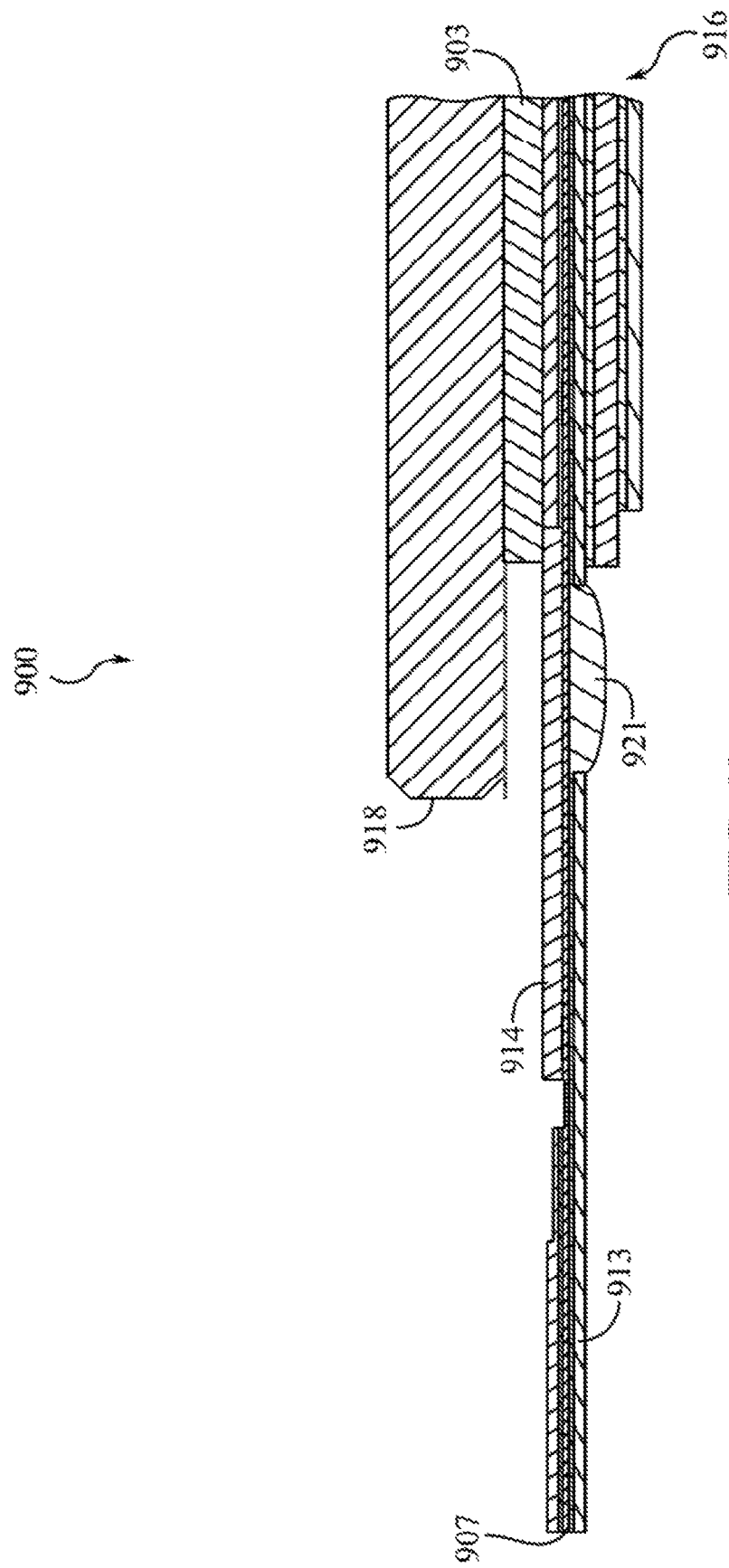
FIG. 10 shows a side cross-sectional view of an electronic device.

In some examples, the potting material 921 is deposited prior to the formation of the bend 911 of the display layer 907. As shown in FIG. 10, potting material 921 can be deposited on the display layer 907 at a time when the display layer 907 is substantially flat, for example, at a stage during the assembly of the device 900. The position of the potting material 921 can be selected based on the geometry of the display layer 907 in its final, assembled form. For example, the potting material 921 can be positioned on a portion of the display layer 907 that will define the bend region 911 when assembled into the electronic device 900.

In some examples, the potting material 921 is pre-cured prior to bending the display layer 907, such as with exposure to ultra-violet (UV) light. The potting material 921 can have a pre-cure modulus of about 0.1 megapascals. During or after pre-curing, the potting material 921 can have a modulus of between about 0.05 megapascals and about 0.5 megapascals, or between about 0.05 megapascals and about 0.25 megapascals. The pre-curing process can cause the potting material 921 to partially solidify and increase the adhesion of the potting material 921 to the display layer 907. By partially solidifying the potting material 921 before the display layer 907 is bent, the potting material can maintain its general shape and location during subsequent processes, such as bending of the display layer 907.

Once the potting material 921 has been pre-cured on the unbent display layer 907, for example using ultraviolet light, the display layer 907 can be bent or folded such that the potting material 921 is positioned in the curved bend region 911. In some examples, the potting material 921 can remain viscous enough to conformally deform into a volume at least partially defined by the bend region 911.

In some examples, the potting material 921 can undergo a final curing phase, such as a final moisture-based curing phase. The potting material 921 can be moisture cured after the display layer 907 is bent, resulting in the potting material 921 being positioned in the bend 911. In some examples, a gap can exist adjacent the potting material 921 to allow for moisture to cure the potting material 921. In some examples, the gap can be defined by the potting material 921 and one or more portions or components of the display assembly 916.

Figure 11:
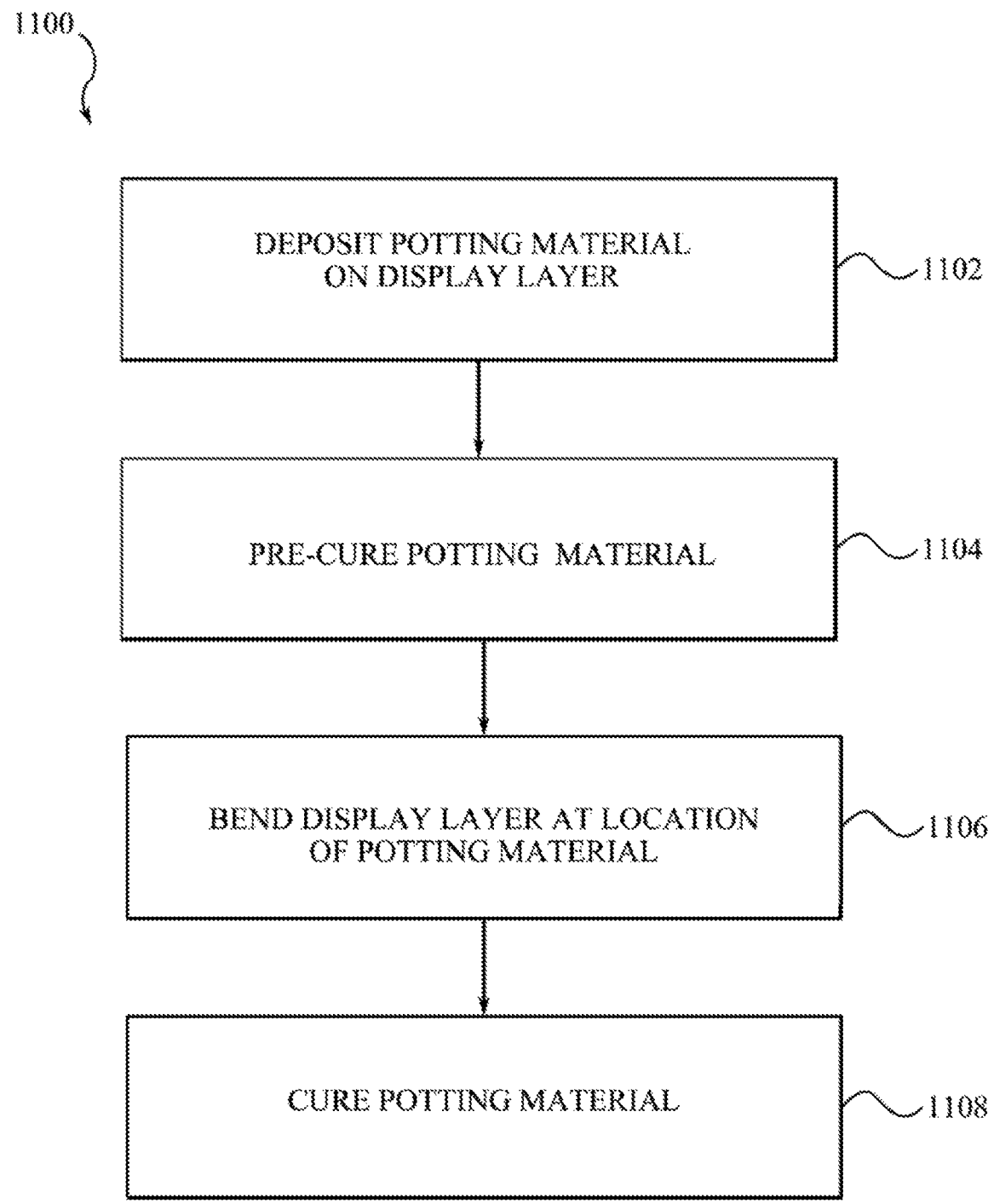
FIG. 11 shows a process flow diagram of a process for depositing a potting material.

FIG. 11 shows a process 1100 for at least partially forming a display assembly including a display layer. At block 1102, potting material can be deposited onto the display layer at one or more desired locations. The position of the potting material on the display layer can be preselected as desired and can be at least partially based on the geometry of the display layer in a final or assembled configuration. For example, the potting material can be placed at one or more locations that can subsequently be bent to define a bend region, as discussed below.

At block 1104, the potting material can be pre-cured, for example, with electromagnetic radiation, such as ultraviolet light. For example, the potting material can be pre-cured with ultraviolet light before the display layer is bent. Pre-curing the potting material can increase adhesion of the potting material to the display layer. Further, pre-curing can cause the potting material to at least partially solidify, and/or to increase the viscosity of the potting material to ensure the potting material maintains its general shape and location during subsequent processes.

At block 1106, after the potting material has been pre-cured on the unbent display layer, for example using ultraviolet light, the display layer is bent or folded such that the potting material is positioned in the volume at least partially defined by the bend region. In some examples, the potting material is positioned in one or more preselected locations that are bent at block 1106. In some examples, the pre-cured potting material can have a low enough viscosity to at least partially deform or move with the surface of the display layer being bent, thereby remaining in a desired location and conforming to the shape of the bend region.

At block 1108, the potting material can undergo a final curing phase, for example a moisture curing phase. The potting material can be cured after the display layer is bent, resulting in the cured potting material being positioned in the bend. In some examples, a gap can exist adjacent the potting material to allow for moisture to cure the potting material. In some examples, the potting material can be formulated to adhere and/or bond to the material or materials including the display layer. For example, the potting material can adhere and/or bond to a polymeric material, such as polyimide. The potting material can be configured to adhere to at least metallic materials such as stainless steel, composite materials such as glass-filled nylon, polymeric materials such as acrylic, and/or pressure sensitive adhesives.

Any number or variety of components in any of the configurations described herein can be included in the display assembly. The components can include any combination of the features described herein and can be arranged in any of the various configurations described herein. The structure and arrangement of components of an input device having a housing with structures described herein, and defining an internal volume, as well as the concepts regarding input components, potting materials, and display assemblies, can apply not only to the specific examples discussed herein, but to any number of examples in any combination. Various examples of electronic devices including support materials having various features in various arrangements are described below, with reference to FIGS. 12-13.

Figure 12:
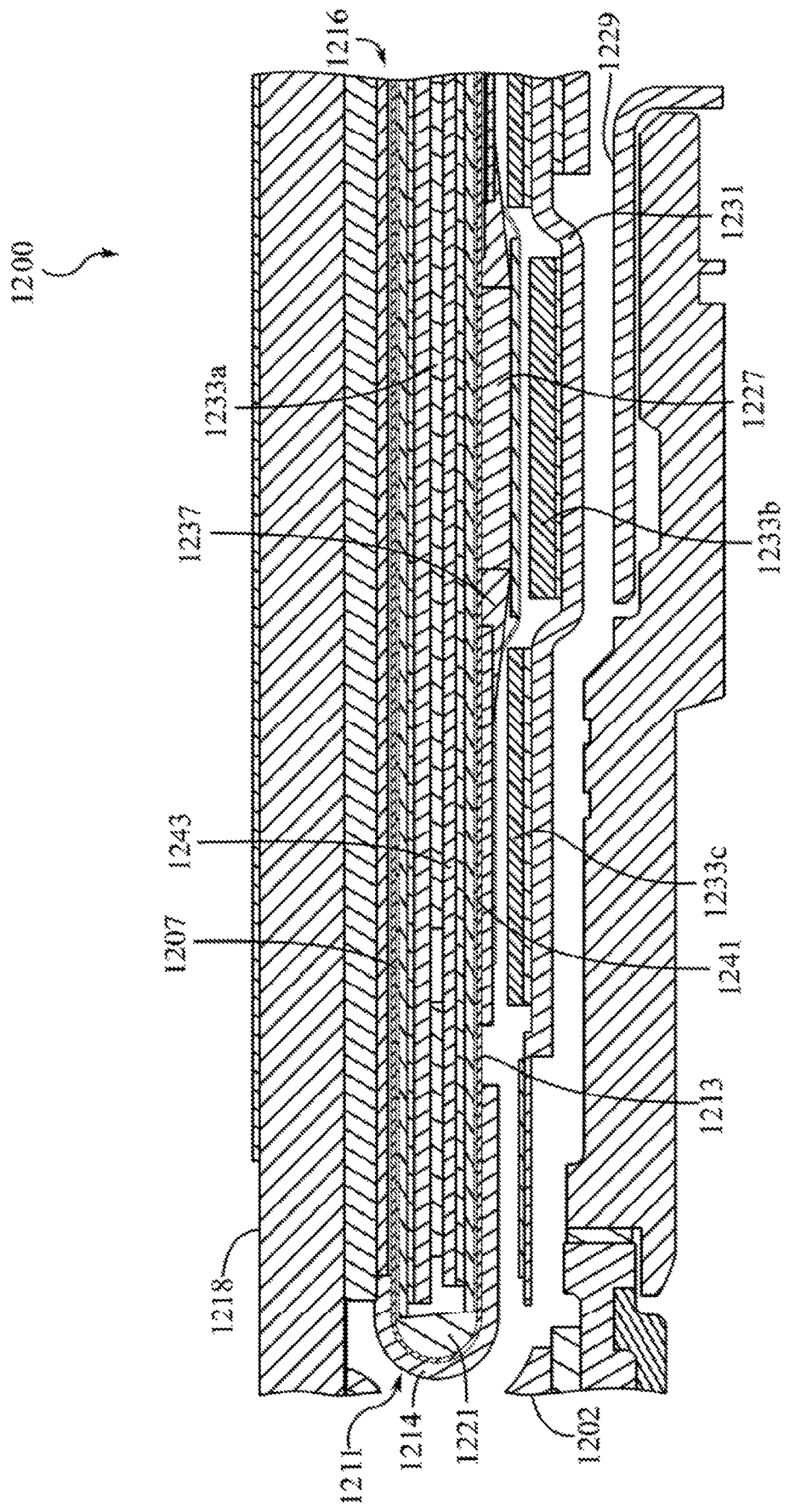
FIG. 12 shows a side cross-sectional view of an electronic device.

FIG. 12 illustrates a cross-sectional view of an electronic device 1200. The electronic device 1200 can be substantially similar to, and can include some or all of the features of any of the electronic devices discussed herein, such as electronic devices 100-900. In some examples, the electronic device 1200 includes a display integrated circuit (DIC) 1227. The DIC 1227 can be positioned directly on a tail portion 1213 of the display layer 1207 (i.e., post bend). Placing the DIC 1227 directly on the tail portion 1213, rather can allow for the DIC to be supported by the tail portion 1213 and/or components that support the display layer 1207, thereby obviating the need for separate components to support the DIC and allowing for that volume to be used by other modules or components of the device.

During use, the display assembly 1216 and the DIC 1227 can be subjected to constrained high energy dynamic events caused by concentrated deflection, or unconstrained dynamic events such as a drop event. Various measures can be employed to improve durability and robustness of the display assembly 1216 and the DIC 1227 in response to the forces exerted by these events. For example, support materials can be used to improve the durability of the display assembly 1216. It will be understood that the following examples can be used separately or in any combination.

The display assembly 1216 can include various support materials that cover surfaces and components of the display assembly 1216. The support materials can provide stiffness and structural support to the display layer 1207 and the DIC 1227. The support materials can be positioned along some or substantially all of the length of the frame 1202 and display assembly 1216.

In some examples, the support materials occupy spaces between the display assembly 1216 and the frame 1202 such that substantially no air gaps are present between the display assembly 1216 and the frame 1202. In some examples, the supportive materials can inhibit sway or movement of the display assembly 1216 relative to the frame 1202. In this manner, the described electronic device 1200 has improved durability over conventional devices.

The supportive materials can be polymeric materials, such as two-part epoxies that are designed to behave like a soft rubber with low levels of shrinkage. In some examples, the supportive materials can include a relatively low modulus so as to not transmit load to the display assembly 1216. In some examples, the supportive materials can include rigid material.

In some examples, the support materials can include a stiffener plate 1241, such as a metal plate, positioned in a common plane (in-plane) with the DIC 1227. In some examples, the stiffener plate 1241 can be offset from the DIC, for instance adjacent or abutting each other. The stiffener plate 1241 can fully or partially surround the DIC 1227. In some examples, the stiffener plate 1241 can included several individual pieces that are positioned around the DIC 1227. In some examples, the stiffener plate 1241 can be positioned between active regions of the display layer 1207 and the tail portion 1213. In some examples, the stiffener plate has a thickness of between about 20 microns and about 100 microns, for example about 70 microns. In some examples, the stiffener plate 1241 has a thickness of about 50 microns and a PSA positioned on the stiffener plate 1241 is about 20 microns thick.

In some examples, the support materials include a potting compound 1237 positioned on the display tail 1213 and at least partially around the DIC 1227. The potting compound 1237 can be positioned between the stiffener plate 1241 and the DIC 1227. In some examples, the potting compound is positioned on the stiffener plate 1241. The potting material 1237 can be conformal to a perimeter of the DIC 1227. In some examples, the potting material 1237 bridges from the stiffener plate 1241 to the DIC 1227. The potting material 1237 can be the same material as the potting material 1221 disposed in the panel bend 1211. In some examples, the potting material 1237 is made from the same material as the strain-neutralization layer 1214.

In some examples, the support materials can include foam. Foam 1233a can be positioned between an active region of the display layer 1207 and the tail portion 1213. In some examples, foam 1233b can be positioned between the DIC 1227 an internal enclosure 1231. The internal enclosure 1231 can be contoured to the display assembly 1216, specifically, the internal enclosure 1231 can be contoured to the DIC 1227. In some examples, foam 1233c can be positioned between the display layer 1207 and the internal enclosure 1231. The foam 1233c can be adhered to the internal enclosure 1231. In some examples, foam (not shown) can be positioned between the DIC 1227 and the tail portion 1213 of the display layer 1207.

The foam 1233a, 1233b, 1233c (collectively 1233) can distribute load that is applied to various location on the electronic device 1200. In some examples, the foam 1233 can accommodate between about 5% and about 50% compression, for example about 20% compression. The foam 1233 can have a thickness of between about 0.1 mm and about 2 mm, for example about 0.3 mm. A uniform distance between the internal enclosure 1231 and other components disposed in the internal volume of the device 1200, colloquially known as the system skyline, can be maintained. Such a uniform distance can prevent hot spots from developing in the device 1200. In some examples, a uniform gap is maintained adjacent the DIC 1227 on the tail portion 1213. Any of the above described supportive materials can be used independently or in any combination with one another.

The support materials can further include potting material 1221 that is deposited in the panel bend region 1211. The potting material 1221 can be substantially similar to the potting material 921 discussed above with reference to FIGS. 9 and 10.

In some examples, construction of the electronic device 1200 can be accomplished by progressively and chronologically building layers onto one another. For instance, the cover glass 1218 can be provided. The display assembly 1216 can then be coupled with the cover glass 1218. The display layer 1207 can then be bent to define the bend region 1211. Potting can be added to the bend region 1211 before or after the display layer 1207 is bent. A stiffener plate 1241 can then be coupled to the display layer 1207. The DIC 1227 can then be coupled to the tail portion 1213 and potting material 1237 disposed around the DIC 1227. Thereafter the frame 1202 can be attached to the display assembly 1216.

Figure 13:
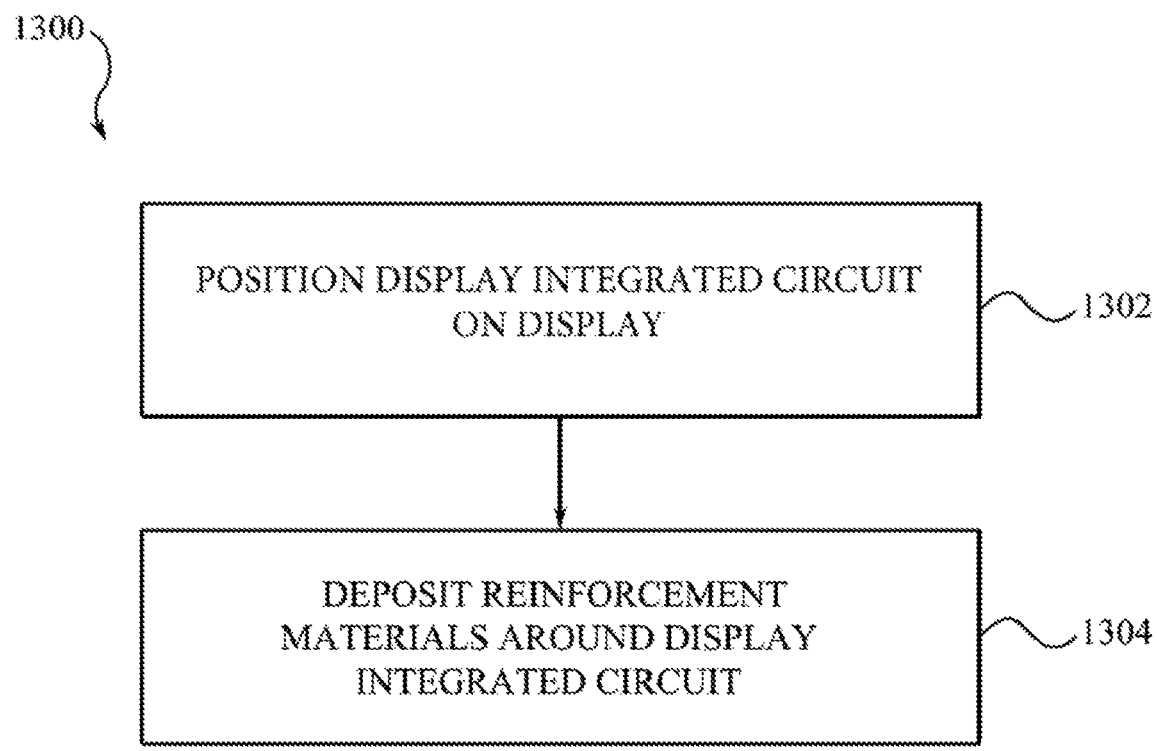
FIG. 13 shows a process flow diagram of a process for reinforcing a display integrated circuit.

FIG. 13 shows a process flow diagram of a process 1300 for improving the durability of a display integrated circuit on a display panel tail. At block 1302, a display integrated circuit (DIC) is positioned on a display panel, for example at the tail. The DIC can be secured to the display panel tail by any appropriate means, including adhesives and/or fasteners.

At block 1304, support or reinforcement materials are deposited around and/or adjacent to the DIC. As discussed above, such supportive materials can include a stiffener plate adjacent to the DIC, and/or between active regions of the display layer and the tail portion, a potting compound positioned on the display tail and around the DIC, foam positioned between the display layer and the DIC, foam positioned between an active region of the display layer and the tail portion, foam positioned between the display layer an internal enclosure, and foam positioned between the DIC and the internal enclosure. Any of the above described supportive materials can be used independently or in any combination with one another.

To the extent applicable to the present technology, gathering and use of data available from various sources can be used to improve the delivery to users of invitational content or any other content that may be of interest to them. The present disclosure contemplates that in some instances, this gathered data may include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:
1. An electronic device comprising:
   a housing at least partially defining an aperture and an internal volume;
   a display assembly positioned in the aperture, the display assembly comprising:
     a display layer including pixels, the display layer comprising a first portion, a bend portion, and a second portion disposed at least partially below the first portion;

the bend portion and a plane extending between the first portion and the second portion at least partially defining a bend volume;

a potting material disposed in the bend volume and contacting a surface of the bend portion;

a display integrated circuit positioned directly on the second portion of the display layer;

a supportive material surrounding and contacting the display integrated circuit; and a flexible circuit electrically coupled to the display layer; and an enclosure disposed in the internal volume adjacent to the display assembly, the enclosure having a shape corresponding to a shape of the display assembly.

2. The electronic device of claim 1, wherein the potting material comprises a curable polymer.

3. The electronic device of claim 1, wherein the potting material has a modulus of about 150 megapascals to about 300 megapascals.

4. The electronic device of claim 1, wherein:
the display assembly comprises a strain-neutralization layer; and
a portion of the display layer is positioned between the strain-neutralization layer and the potting material.

5. The electronic device of claim 4, wherein the strain-neutralization layer comprises an epoxy.

6. The electronic device of claim 1, wherein the potting material comprises an ultraviolet light curable material.

7. The electronic device of claim 1, wherein the potting material comprises a moisture curable material.

8. The electronic device of claim 1, wherein the potting material conforms to a surface of the bend portion.

9. The electronic device of claim 1, wherein the display layer and the potting material define a gap.

10. An electronic device comprising:
a housing defining an aperture;
a display assembly positioned in the aperture, the display assembly comprising:
a display layer comprising:
a plurality of pixels;
a first portion;
a bend portion; and
a tail portion; and
a display integrated circuit directly positioned on the tail portion; and
a supportive material contacting and conforming to a perimeter of the display integrated circuit and structurally supporting the display integrated circuit on the tail portion.

11. The electronic device of claim 10, wherein the display assembly further comprises a stiffener plate positioned in-plane with the display integrated circuit.

12. The electronic device of claim 11, wherein the stiffener plate has a thickness of about 50 microns to about 90 microns.

13. The electronic device of claim 10, wherein the supportive material comprises a potting compound.

14. The electronic device of claim 10, wherein the display assembly further comprises:
an internal enclosure; and
a foam positioned between the display integrated circuit and the internal enclosure.

15. The electronic device of claim 14, wherein the foam is positioned between the first portion and the tail portion.

16. A display assembly, comprising:
a display layer comprising:
an active area including a plurality of illuminable pixels;
a tail portion; and
a bend portion connecting the active area and the tail portion, the bend portion defining a first curved surface and a second curved surface opposite the first curved surface;
a potting material disposed on the first curved surface;
a strain-neutralization layer overlaying at least a portion of the second curved surface;
a display integrated circuit positioned directly on the tail portion;
a stiffener plate positioned in-plane with the display integrated circuit; and
a supportive material positioned between the stiffener plate and the display integrated circuit.

17. The display assembly of claim 16, wherein the potting material is adhered to the display layer.

18. The display assembly of claim 16, wherein the display layer comprises polyimide.

19. The display assembly of claim 16, wherein the tail portion is disposed below the active area.

* * * * *